US012346069B2

United States Patent
Karaiskaj (10) Patent No.: US 12,346,069 B2
(45) Date of Patent: Jul. 1, 2025

(54) ATOMIC CLOCK UTILIZING SPIN-DEPENDENT RECOMBINATION

(71) Applicant: UNIVERSITY OF SOUTH FLORIDA, Tampa, FL (US)

(72) Inventor: Denis Karaiskaj, Tampa, FL (US)

(73) Assignee: University of South Florida, Tampa, FL (US)

(*) Notice: Subject to any disclaimer, the term of this patent is extended or adjusted under 35 U.S.C. 154(b) by 0 days.

(21) Appl. No.: 18/507,419

(22) Filed: Nov. 13, 2023

(65) Prior Publication Data

US 2024/0160154 A1    May 16, 2024

Related U.S. Application Data

(60) Provisional application No. 63/425,797, filed on Nov. 16, 2022.

(51) Int. Cl.
*G04F 5/14* (2006.01)
*H03L 7/26* (2006.01)

(52) U.S. Cl.
CPC . *G04F 5/14* (2013.01); *H03L 7/26* (2013.01)

(58) Field of Classification Search
CPC ... G04F 5/14; G04F 5/145; H03L 7/26; H03B 17/00
See application file for complete search history.

(56) References Cited

U.S. PATENT DOCUMENTS

| 8,299,858 | B2 | 10/2012 | Gan |
| 8,816,784 | B1 * | 8/2014 | Karaiskaj ............ H03L 7/26 |
| | | | 331/3 |
| 9,360,844 | B2 | 6/2016 | Gan |
| 2015/0372686 | A1 | 12/2015 | Parsa et al. |

FOREIGN PATENT DOCUMENTS

DE    102018208102 A1 *  11/2019

OTHER PUBLICATIONS

Itoh, Kohei M., and Hideyuki Watanabe. "Isotope engineering of silicon and diamond for quantum computing and sensing applications." MRS communications 4.4 (2014): 143-157. (Year: 2014).*
Mortemousque, Pierre-André, et al. "Hyperfine clock transitions of bismuth donors in silicon detected by spin-dependent recombination." Physical Review B 89.15 (2014): 155202. (Year: 2014).*
Saeedi, K., et al. "Optical pumping and readout of bismuth hyperfine states in silicon for atomic clock applications." Scientific reports 5.1 (2015): 10493: 1-6.
Wolfowicz, Gary, et al. "Atomic clock transitions in silicon-based spin qubits." Nature nanotechnology 8.8 (2013): 561-564.

* cited by examiner

*Primary Examiner* — Ryan Johnson
(74) *Attorney, Agent, or Firm* — Quarles & Brady LLP; Yakov Sidorin (57) ABSTRACT

A silicon-based atomic clock for use in an electronic device structured to employ spin-dependent recombination in the silicon crystal. In at last one implementation, a source of energy configured to excite the impurity atoms within the silicon crystal includes a source of thermal energy but not a source of light or a source of broadband light that is not matched to said energy level transition of the impurity atoms.

17 Claims, 9 Drawing Sheets

ATOMIC CLOCK UTILIZING SPIN-DEPENDENT RECOMBINATION

CROSS-REFERENCE TO RELATED APPLICATIONS

This US Patent Application claims priority from and benefit of the U.S. Provisional Patent Application No. 63/425,797 filed on Nov. 16, 2022, the disclosure of which is incorporated by reference herein.

TECHNICAL FIELD

The present invention relates to atomic clocks and, more particularly, to atomic clock devices employing a single-isotope silicon crystal the impurities of which are excited with the use of a source of excitation energy that is not resonant with the energy level transition of such impurities.

RELATED ART

Performance of many electronic devices is often limited by the performance of the clocks they use. For example, the receiver in a global positioning system (GPS) works by attempting to align an internally-generated pseudorandom signal to an identical signal sent by a satellite and measuring the phase difference between the two signals. The receiver calculates the time required by the satellite signal to reach the receiver and thereby gives the distance between the satellite and the receiver. In this system, accurate timing is needed not only for precise determination of distance, but also for fast acquisition of the satellite signal. Other examples in which timing determines the ultimate performance of the system range from parallel analog-to-digital converters to spread-spectrum communications. Furthermore, frequency references provide the basis for a large number of other applications, such as digital communication, synchronization of networks, and power distribution.

In applications such as those identified above, an atomic clock would greatly enhance the performance of the system. Like quartz oscillators and clocks, atomic clocks function by generating a very stable frequency from a reference. The main difference is that a quartz oscillator derives its frequency from a mechanically vibrating reference, which makes the frequency sensitive to long-term changes in mechanical dimensions and stress. An atomic clock on the other hand derives its frequency from the energy difference between atomic states, which is a constant of nature and is therefore predictable and stable. Unfortunately, the size, power consumption, and use of conventional laser source as part of atomic clock apparatus continue to contribute to difficulty of integration of the atomic clocks with existing electronic devices and remain limiting factors for the use of atomic clocks in these devices.

SUMMARY OF THE INVENTION

Embodiments of the invention provide a method for generating a clock signal. Such method includes a step of exciting an energy level transition in a single-isotope silicon crystal (which crystal is doped with impurity atoms) with excitation energy a frequency of which is not equal to the frequency of the energy level transition; a step of detecting the energy level transition based at least in part on a spin-dependent recombination in such single-isotope silicon crystal; and a step of generating a clock signal based upon the detected energy level transition. In at least one of embodiments, the method may additionally include a step of isotopically purifying silicon to produce such single-isotope silicon crystal and doping such silicon crystal with the impurity atoms. The process of doping may include doping the single-isotope silicon crystal with the impurity atoms selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, a defect caused by irradiation of the silicon crystal, and combinations thereof. Alternatively or in addition, and substantially in every implementation of the method, the step of detecting the energy level transition may include detecting resonance of hyperfine splitting levels resulting for the energy transition by measuring a resistivity across the silicon crystal, and/or the step of detecting may include measuring a current of a p-n junction formed in the silicon crystal (where such current is dependent on the recombination rate in the space charge region of the p-n junction). Optionally, the process of exciting the energy level transition may be devoid of (that is, does not include) using light for such excitation. Alternatively or in addition—and substantially in every implementation—the method may include providing a first magnetic field with the use of a first magnetic coil that surrounds at least a portion of the silicon crystal to drive a hyperfine resonance of the impurity atoms by generating an initial spin coherence of impurity nuclei within the silicon crystal. (In this specific case, optionally, an additional step may be employed: with the use of the same first magnetic coil, providing a static second magnetic field, where a first vector of the first magnetic field is substantially parallel to a second vector of the second magnetic field. Alternatively or in addition, in this specific case, the method may include a step of providing a static second magnetic field with the use of a second magnetic coil that surrounds at least a portion of the silicon crystal, where a first vector of the first magnetic field is parallel to a second vector of the second magnetic field. Optionally, the first magnetic coil may be employed as the device that is configured to carry out detecting the energy level transition.)

Embodiments of the invention also provide a silicon-based atomic clock that is configured to be used in an electronic device. Such clock includes a single-isotope silicon crystal (doped with impurity atoms configured to have an energy level transition of the impurity atoms to be used as a frequency resonance of the atomic clock); a source of energy (configured to excite the impurity atoms within the silicon crystal); and a detection device configured to detect the energy level transition of the impurity atoms based at least in part on a spin-dependent recombination in such silicon crystal. In at least one embodiment, the source of energy may be configured as (a) a source of thermal energy but not a source of light, or (b) a source of broadband light that is not spectrally- or frequency-wise matched to the energy level transition of the impurity atoms. (In the letter case, such broadband light may be configured to not be resonant with the energy level transition.) When the source of energy is configured as a source of light, such source of light may be a light-emitting diode. Alternatively or in addition—and at least in one embodiment—the clock may satisfy at least one of the following conditions: (i) the single-isotope silicon crystal is a $^{28}$Si crystal; (ii) the impurity atoms are single-isotope impurity atoms; and (iii) the impurity atoms are selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, a defect caused by irradiation of the silicon crystal, and combinations thereof. Alternatively or in addition, and substantially in every implementation, the detection device may be configured to measure a current of a p-n junction formed in the silicon crystal (where the current is dependent on the recombination rate in the space charge region of the p-n junction). Optionally, such detection device may be configured to measure a resistivity across the silicon crystal.

An embodiment of the atomic clock may include a p-i-n junction diode or a MOSFET and/or a read-out device configured to interrogate hyperfine splitting, resulting from interaction of impurity nuclei and donor electrons and/or be configured to operate at a substantially room temperature. (In the latter case, the embodiment may be configured to necessarily have at least a portion of the impurity atoms neutral and not ionized.) In at least one case, the doping density of the silicon crystal of the clock with the impurity atoms is chosen to be in the range from about $5 \times 10^{16}$ cm−3 to about $5 \times 10^{18}$ cm$^{-3}$ to form impurity energy levels in a conduction band of the crystal are no longer discrete but broadened due to impurity pairs and clusters, thereby maintaining a portion of the impurity toms substantially neutral at room temperature. At least one embodiment of the clock is made to be devoid of a photodetector. Optionally, an embodiment of the clock may include a first magnetic coil surrounding at least a portion of said silicon crystal and configured to provide a first magnetic field to drive a hyperfine resonance of the impurity atoms by generating an initial spin coherence of impurity nuclei within the silicon crystal. Such first magnetic coil may be configured to provide a static second magnetic field (where a first vector of the first magnetic field is substantially parallel to a second vector of the second magnetic field). Optionally, an embodiment of the clock may additionally include a second magnetic coil surrounding at least a portion of the silicon crystal and configured to provide a static second magnetic field (here, a first vector of the first magnetic field is parallel to a second vector of the second magnetic field). At least in one specific case, the first magnetic coil is configured as the detection device for interrogation and/or excitation of the energy level transition.

Furthermore, embodiments of the invention additionally provide a silicon-based atomic clock configured for use in an electronic device. Such clock includes a single-isotope silicon crystal (doped with impurity atoms having an energy level transition of the impurity atoms to be used as a frequency resonance of the atomic clock and at a doping density configured to have at least some of the impurity atoms neutral and not ionized when excited with a source of energy of said atomic clock) and a source of energy that is either (i) a source of thermal energy but not a source of light, or (ii) a source of broadband light that is not matched to an energy level transition of the impurity atoms. In at least one embodiment, the single-isotope silicon crystal is a $^{28}$Si crystal; and/or the impurity atoms are single-isotope impurity atoms; and/or the impurity atoms are selected from the group consisting of phosphorus (P), arsenic (As), antimony (Sb), lithium (Li), sodium (Na), sulfur (S), selenium (Se), tellurium (Te), boron (B), gallium (Ga), indium (In), aluminum (Al), beryllium (Be), zinc (Zn), gold (Au), silver (Ag), platinum (Pt), bismuth (Bi), and copper (Cu) atoms, a defect cause by irradiation of the silicon crystal, and combinations thereof. Alternatively or in addition—and at least in one implementation of the atomic clock—a doping density of the silicon crystal with the impurity atoms is chosen in the range from about $5 \times 10^{16}$ cm−3 to about $5 \times 10^{18}$ cm$^{-3}$ to form impurity levels in the conduction band that are no longer discrete but broadened due to impurity pairs and clusters, thereby maintaining a portion of the impurity atoms substantially neutral at room temperature. At least one implementation may additionally include a first magnetic coil (surrounding at least a portion of the silicon crystal and configured to provide a first magnetic field to drive a hyperfine resonance of the impurity atoms by generating an initial spin coherence of impurity nuclei within the silicon crystal). If this is the case, the first magnetic coil may be configured to provide a static second magnetic field (such that a first vector of the first magnetic field is substantially parallel to a second vector of the second magnetic field) and/or, if this is the case, the embodiment may additionally include a second magnetic coil (surrounding at least a portion of the silicon crystal and configured to provide a static second magnetic field such that the first vector of the first magnetic field is parallel to a second vector of the second magnetic field). Alternatively or in addition—and substantially in every implementation of the atomic clock—the clock may optionally include a detection device configured to detect the energy level transition of the impurity atoms based at least in part of an electrical measurement of conductivity (which device, in one specific case, may be configured to detect the energy level transition based at least in part of an electrical measurement of conductivity that is not photoconductivity); and/or the clock may optionally include the detection device configured to detect the energy level transition of the impurity atoms based at least in part on a spin-dependent recombination in the silicon crystal of the clock. Optionally, such detection device may be configured to measure a current of a p-n junction formed in the silicon crystal (which current is dependent on the recombination rate in the space charge region of the p-n junction). In at least one case, the atomic clock is devoid of a photodetector.

BRIEF DESCRIPTION OF THE DRAWINGS

The invention will be more fully understood by referring to the following Detailed Description of Specific Embodiments in conjunction with the Drawings. Matching reference numerals designate corresponding parts throughout the Drawings, which are not necessarily drawn to scale, and of which.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

As can be appreciated by a skilled artisan, it would be desirable to have an atomic clock that can be practically integrated with existing electronic devices. Described below are silicon-based atomic clocks that are well suited for such integration. As described below, silicon-based atomic clocks are desirable not only because of their robustness as compared to gas-based atomic clocks, but also because they can be miniaturized to the point at which they can be incorporated into chip-sized devices. It is to be understood that those embodiments are example implementations of the disclosed inventions and that alternative embodiments are possible. All such embodiments are intended to fall within the scope of this disclosure.

The accuracy of an atomic clock is determined in part by the frequency width of the resonance that it generates when being probed. Generally speaking, the narrower the frequency width, the greater the accuracy of the clock. Resonances cause by the presence of donors and acceptors in naturally-occurring isotopic silicon are very narrow due in part to the crystalline perfection and chemical purity achieved in the crystal growth of silicon. However, the frequency width of most impurity transitions is wider because of the isotopic randomness of the material. The technical subject matter of this disclosure relates to that of U.S. Pat. Nos. 8,816,784 and/or 9,052,698, disclosure of each of which is incorporated herein by reference.

The advent of isotopically-engineered silicon has made energy level transitions due to impurity dopants possible for atomic clock applications. The resonance frequency width can be substantially narrowed by producing single-isotope silicon crystals. For example, the full width at half maximum (FWHM) of phosphorus bound exciton transitions in single-isotope silicon was measured to be approximately 2.4 MHz, which is in the order of atomic transitions. Furthermore, hyperfine splitting of 0.12 GHz was observed at very modest magnetic fields, making isotopically-engineered silicon a candidate for solid-state atomic clocks. In view of this, it is proposed that energy level transitions in silicon be used as frequency standards for atomic clocks. Example materials, systems, and methods for generating clock signals based upon such transitions are described below.

Figure 1A:
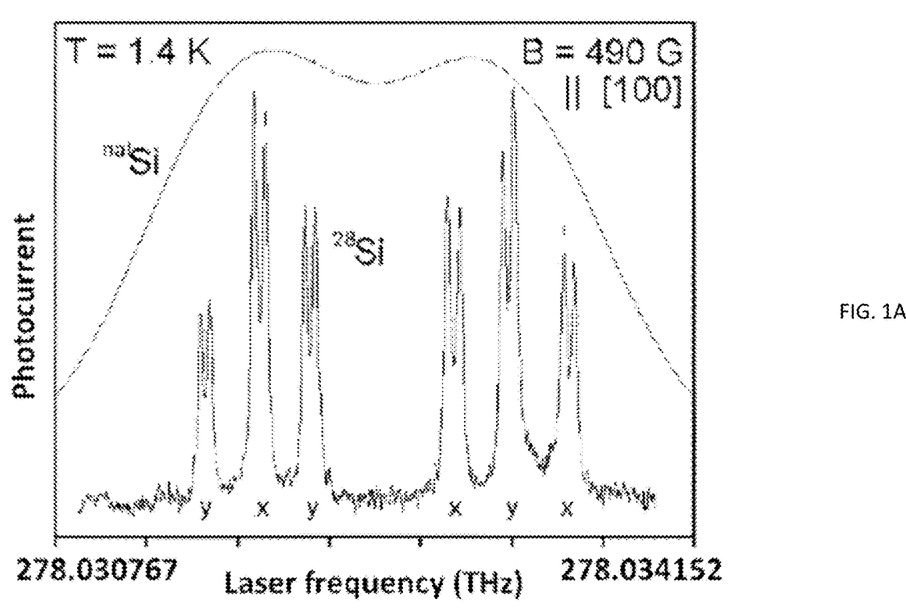
FIG. 1A is a graph that shows the Zeeman spectrum of phosphorus bound exciton, no-photon transitions in a sample of 99.991% $^{28}$Si.
Figure 1B:
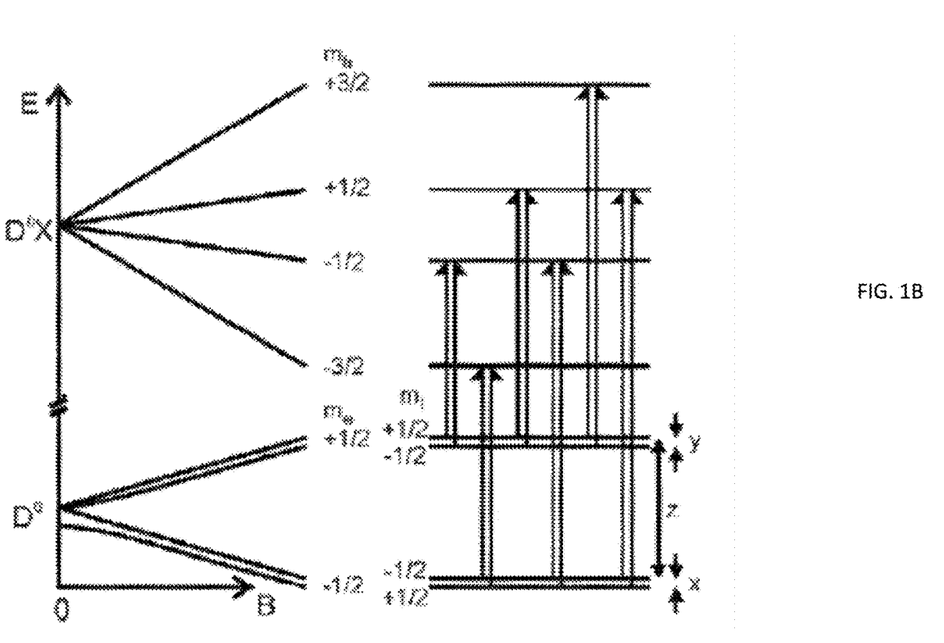
FIG. 1B is a level scheme describing the origin of the transitions of FIG. 1A.

FIG. 1A shows the Zeeman spectrum of the phosphorus bound exciton, no-phonon transitions in a silicon sample enriched to 99.991% $^{28}$Si. The photoluminescence excitation spectra at T=1.4 K with a magnetic field of 490 G parallel to the axis are shown in the this figure. The same spectra obtained in silicon of natural isotopic composition ($^{nat}$Si) are also shown in the figure for purposes of comparison. FIG. 1B is a level scheme describing the origin of the transitions (six doublets) shown in FIG. 1A. $D^0$, the neutral donor, is the ground state of the phosphorus bound exciton. $D^0$ has a zero-field hyperfine splitting of 0.12 GHz and, under an applied magnetic field, splits into four hyperfine levels (shown on the right) determined by the projections of the electron spin $m_e$=+/−1/2 and the nuclear spin $m_I$=+/−1/2. The donor bound exciton $D^0X$ has two electrons in a spin singlet and, under a magnetic field, splits only according to the j=3/2 hole projections. The six allowed transitions are ordered in increasing energy from left to right, in correspondence with the transitions on the left side of the figure.

As noted above, the stability of an atomic clock is determined in part by the frequency width of the resonance that it generates when probed. Atomic clocks are often characterized by their Allan deviation $\sigma(\tau)$, which is a measure of the fractional frequency stability as a function of averaging time $\tau$. Over short averaging times, the stability of many atomic clocks is characterized by white frequency noise. The Allen deviation is given by, $$\sigma(\tau) = (\chi/\left(\frac{QS}{N}\right))(1/\sqrt{\tau})$$

in terms of signal-to-noise ratio SN and the resonance quality factor Q. The resonance quality is defined as the ratio of resonance frequency $v_0$ over the linewidth $\Delta v$, $Q=v_0/\Delta v$.

The energy level transitions of impurities often found in silicon (Si) are used as a frequency standard for the atomic clocks. Silicon in the naturally-occurring isotopic composition consists of 92.23% $^{28}$Si+4.67% $^{29}$Si+3.10% $^{30}$Si. Therefore, the importance of inhomogeneous isotope broadening effects in setting many of the broadening limits in natural silicon was at first surprising given that natural silicon is close to monoisotopic. However, the vast majority of impurity transitions in natural silicon were found be dominated by isotopic broadening. In addition to significantly broadening the donor and acceptor transitions in the far and near infrared, the isotopic randomness was the origin of the splitting of the ground state of acceptors in silicon. A theoretical framework was developed that provided clear insights on how the isotopic randomness splits the fourfold degenerate ground state of acceptors in natural silicon into doublets. The removal of this remaining source of broadening revealed that impurity transitions in silicon are "atomic like." Therefore, the isotopically purified/enriched versions $^{28}$Si, $^{29}$Si, and $^{30}$Si, and in particular the abundant .sup.28Si isotope, could be doped at approximately $10^{12}$ cm$^{-3}$ to $10^{14}$ cm$^{-3}$ with donors or acceptors and effectively used for atomic clock applications.

Notably, the theoretical modeling used to reproduce the splitting of the acceptor ground state predicts only a small energy shift to the transitions of individual donor impurities (and a splitting of the ground state for acceptors). The broadening observed spectroscopically is a result of statistical averaging over a large ensemble of impurities. Therefore, isolating individual donor impurity atoms in silicon crystals of natural isotopic composition would have a similar effect as removing the isotopic randomness. If laser light is used to excite the crystal and interrogate the resonance, this would mean that the laser frequency should be matched to the impurity transition. In principle, all the transitions of donors and acceptors in natural and isotopically-enriched silicon, including and their hyperfine splitting, could be used to build an atomic clock. Donors and acceptor impurities in silicon, with few exceptions such as the phosphorus $^{31}$P, come in different isotopes. For example the most common acceptor, boron, has two isotopes in the natural occurrence $^{10}$B and $^{11}$B, with a ratio of 80% to 20%. The impurity atoms used could be in their natural occurrence or single isotope such as boron ($^{11}$B). There is a shift in the ionization energy for each of the isotopes, therefore using single-isotope impurities may be desirable.

Figure 2A:
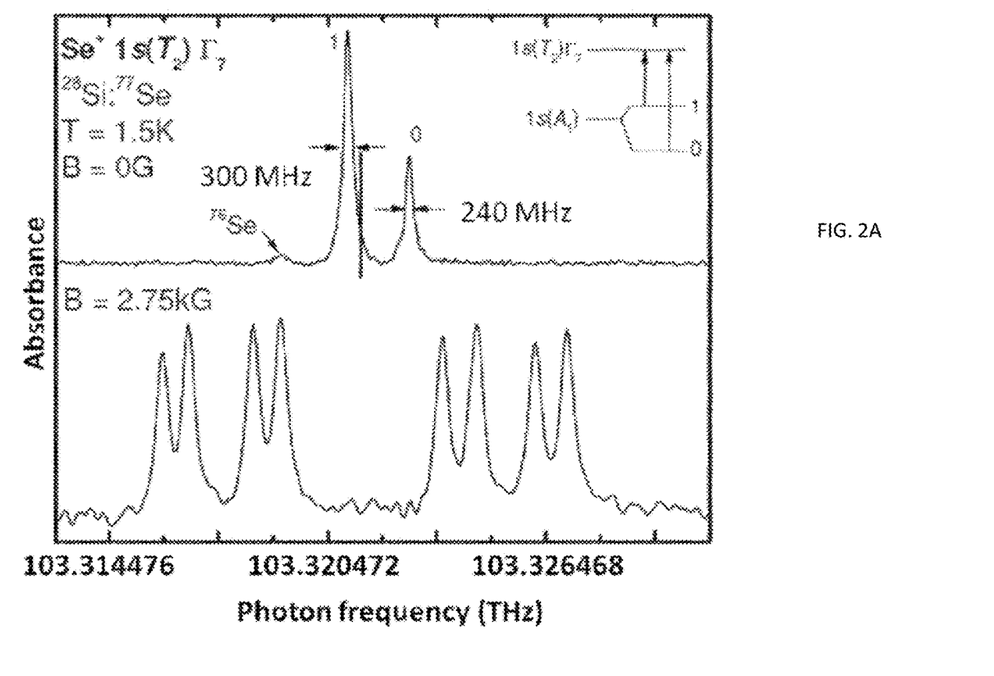
FIG. 2A is a graph that shows the spectra of $^{77}$Se$^+$1s(Ts)Γ$_7$ transition in $^{28}$Si.
Figure 2B:
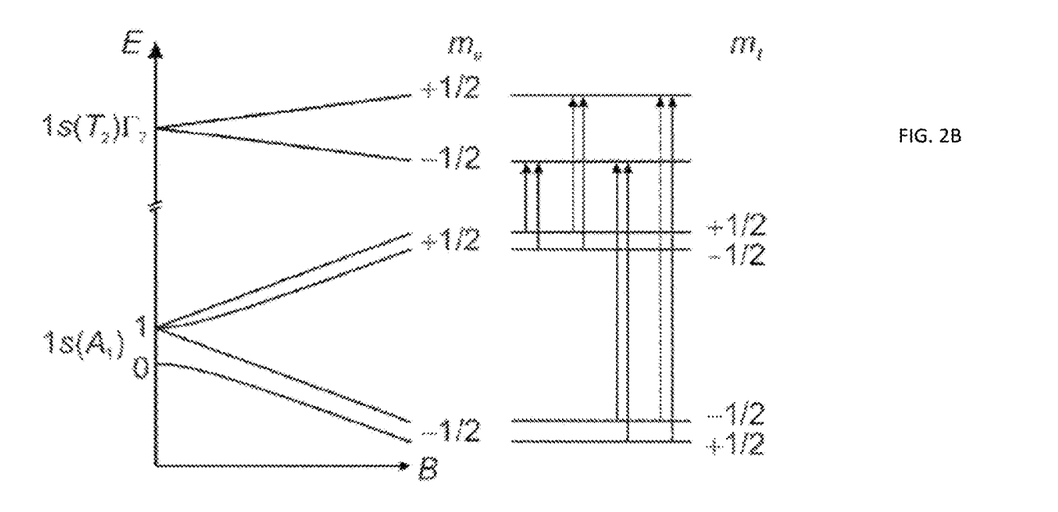
FIG. 2B is a level scheme describing the origin of the transitions of FIG. 2A.

FIG. 2A shows the spectra of the $^{77}$Se$^+$1s(T$_2$)$\Gamma_7$ transition in $^{28}$Si. Illustrated in the top of the figure are the spectra without an external magnetic field showing the ground-state hyperfine splitting. The spectra show extremely narrow lines with a FWHM of 240 MHz. Residuals of the $^{76}$Se can be seen and the vertical line is located halfway between the $^{76}$Se and $^{78}$Se energies. In the bottom of the figure are the spectra under a 2750 G magnetic field. Four doublets are observed. FIG. 2B is a level diagram for the $^{77}$Se$^+$1s(T$_2$)$\Gamma_7$ transitions indicating the origin of the eight components shown in the bottom of FIG. 2A.

Impurity Transitions of Interest

Impurity transitions that can be used for atomic clock applications will now be described. Impurity atoms that contribute free electrons to the host crystal are known as donors, whereas atoms that remove electrons (or create holes) are known as acceptors. The transitions to be used as the frequency standard could originate from (1) a neutral donor or acceptor in natural or isotopically-enriched silicon or (2) excitons (electron-hole pairs) bound to neutral donors or acceptors in natural or isotopically-enriched silicon, called impurity bound excitons. Substitutional group-V atoms include phosphorus (P), arsenic (As), and antimony (Sb), and interstitial monovalent atoms include lithium (Li) and sodium (Na). The group-V atoms have one more valence electron than the silicon atom they replace. Furthermore, this electron is loosely bound to the group-V atom in silicon so that it can be easily excited into the conduction band of the host silicon crystal. Substitutional group-VI atoms such as sulfur (S), selenium (Se), and tellurium (Te) can contribute up to two electrons and are known as double donors. Boron (B), gallium (Ga), indium (In), and aluminum (Al) are shallow acceptors in silicon. All these atoms belong to group III of the periodical table and have one less valence electron than silicon. Therefore when these atoms substitute a silicon atom they create a hole that is loosely bound to the negatively-charged acceptor. Substitutional group-II atoms such as beryllium (Be) and zinc (Zn) in silicon can contribute two positive charges to the host crystal and are called double acceptors. Deeper impurities like gold (Au), silver (Ag), platinum (Pt), and copper (Cu) are more likely to remain neutral at room temperature, and therefore can be ionized or neutralized using optical excitation.

Neutral Donor and Acceptor Transitions

The discrete states of the donor electron are classified according to their principal quantum number n, angular momentum I, and spin. In atomic physics these states are denoted as 1s, 2s, 2p, etc. and similar notations are used to denote the bound states of shallow impurities. These transitions typically need to be interrogated in the far infrared.

Figure 3A:
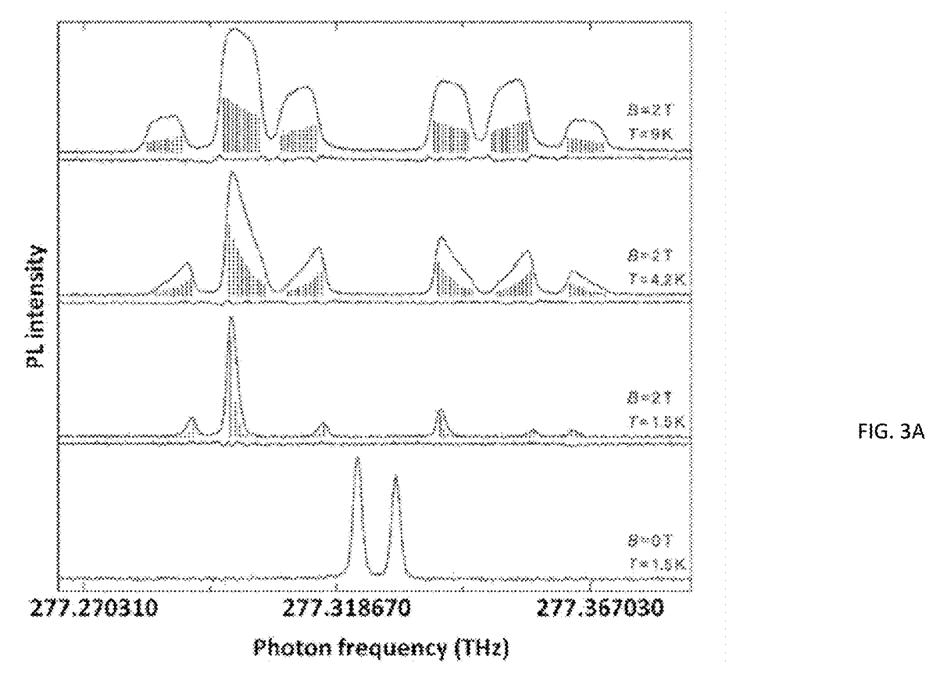
FIG. 3A is a graph of photoluminescence of bismuth no-phonon bound exciton D$^0$X transitions within single-isotope silicon at zero magnetic field and at 2 Tesla.
Figure 3B:
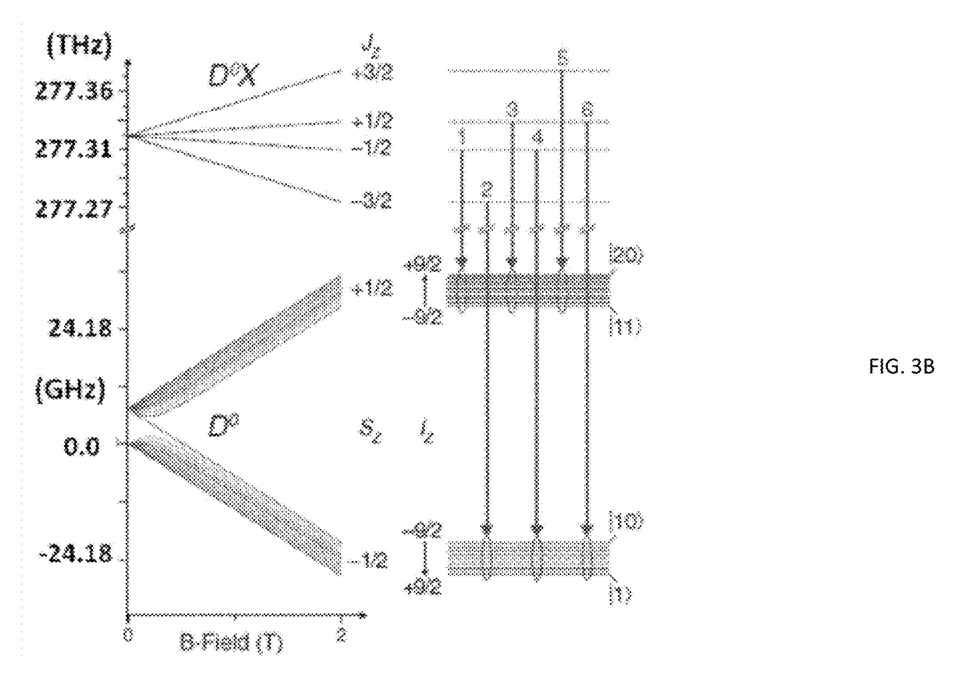
FIG. 3B is a level scheme describing the transitions of FIG. 3A indicating the origin of the photoluminescence structure at the zero and 2 Tesla magnetic fields.

FIG. 3A shows the photoluminescence of the bismuth (Bi) no-phonon bound exciton D$^0$X transitions at zero magnetic field and at 2 Tesla for different temperatures. The vertical lines in the figure indicate the relative strengths of individual hyperfine components. FIG. 3B shows Zeeman level diagrams for the transitions from the bismuth bound exciton D$^0$X to the neutral donor D$^0$ indicating the origin of the photoluminescence structure at zero and 2 Tesla magnetic field. J$_z$ identifies the hole angular momentum projections in D$^0$X, whereas S$_z$ and I$_z$ identify electron and nuclear spin projections in D$^0$, respectively. The allowed transitions at 2T are identified on the right in order of increasing energy, with each having 10 hyperfine components.

No-Phonon Transitions of Impurity Bound Excitons

When the silicon crystal contains a small number of donors and acceptors in their neutral state, the excitons will be attracted to these impurities. Because this attraction lowers the exciton energy, neutral impurities at low temperatures are very efficient at trapping excitons to form the impurity bound excitons. The impurity bound exciton is a multi-particle system. In the case of an exciton bound to donors, it comprises two interacting electrons and one hole, whereas in the case of one electron bound to a neutral acceptor, it comprises two interacting holes and one electron. In silicon, electrons at the conduction band minimum and holes at the valence band maximum can recombine by emission of a characteristic photon. Silicon is an indirect bandgap semiconductor, i.e., the maximum of the valence band and minimum of the conduction band are not at the same position in k-space. Therefore, electrons and holes can recombine and emit a photon with the help of k-vector conserving phonon. When a phonon fulfills the k-vector conservation requirement, the transition is called phonon assisted. However, it is possible for impurity bound excitons to have no-phonon transitions, i.e., transitions that do not invoke a k-vector conserving phonon. The spatial localization of the exciton to the impurity site in real space leads to a greater delocalization/diffusiveness of the electron and hole wave functions in k-space. This leads to an overlap of the electron and hole wave functions thus permitting electron-hole transitions that conserve the k-vector. The intensity of no-phonon transitions will therefore increase with increasing localization energy.

Figure 4A:
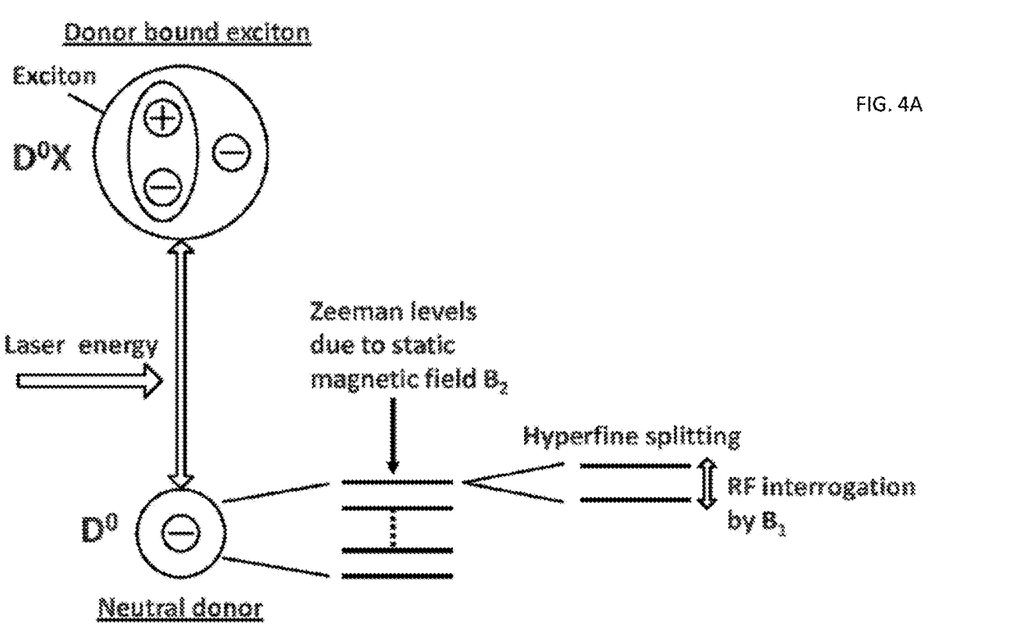
FIG. 4A is a schematic drawing that illustrates a no-phonon bound exciton transition that can be used to build an atomic clock.
Figure 4B:
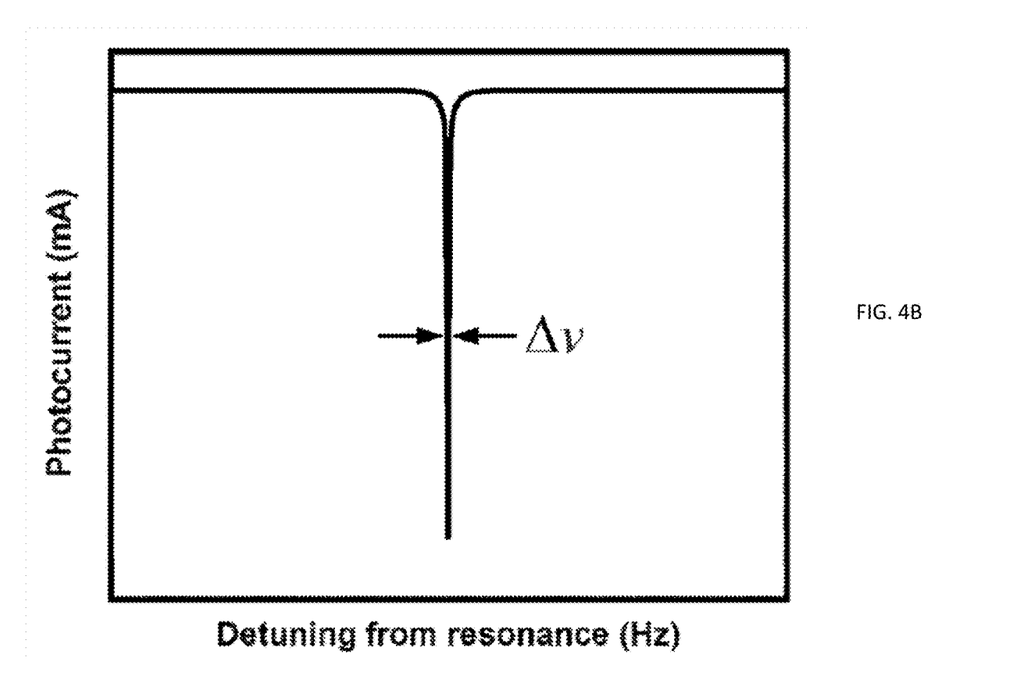
FIG. 4B is a graph of a measured photocurrent as an RF frequency is scanned over the hyperfine splitting shown in FIG. 4A.

To this end, FIG. 4A shows schematic of a no-phonon impurity bound exciton transition that can be used to build an atomic clock. The donor bound exciton is the excited state of the system, which can be optically excited by a frequency-stabilized laser, such as a vertical cavity surface-emitting laser (VCSEL). The Coulomb bound electron-hole pair recombines leaving the neutral donor behind. A small static magnetic field B$_2$ splits the donor ground state into its Zeeman sublevels, which are further split by the hyperfine interaction. A small coil can be used to provide a field (e.g., radio frequency (RF) field) B$_1$ that is used to interrogate the hyperfine resonance. FIG. 4B shows the measured photocurrent as the RF frequency is scanned over the hyperfine splitting frequency. The measure Δv corresponds to the frequency bandwidth of the resonance peak.

Greater localization of the electrons and holes in real space implies greater delocalization/diffusiveness in k-space. As a result, deeper impurities with higher ionization energy will have stronger no-phonon transitions than shallower impurities. No-phonon transitions of impurity bound excitons in silicon can be exceedingly narrow. Phonon-assisted transitions will, in general, be broader than no-phonon transitions because of the dispersion in the phonon spectrum. In donor bound exciton transitions, one electron and hole forming the exciton recombine leaving a neutral donor behind, whereas in the acceptor bound exciton one electron and hole recombine leaving a neutral acceptor behind. The neutral donor is split in the magnetic field into the projections of the electron spin $m_e=+-1/2$, whereas the neutral acceptor is split according the hole angular momentum j=3/2. Therefore, acceptor bound exciton transitions have, in general, a more complicated structure. Because of the narrowing of the bound exciton transitions and the absence of the nuclear spin in isotopically enriched $^{28}$Si, the splitting because of hyperfine interactions with the nuclear spin of the impurity atom can be clearly resolved. Similar to atomic transitions, such as the rubidium (Rb) or cesium (Cs) standards, the hyperfine splitting of impurity bound exciton transitions in silicon can be used for atomic clocks.

Example of Impurity Atoms for Atomic Clock Applications

Candidates for transitions will now be discussed. Donor bound exciton transitions are usually narrower than the acceptor counterparts and have a simpler structure. The phosphorus donor impurity can be easily introduced in silicon, which makes this a desirable impurity. The no-phonon homogeneous linewidth of the bound exciton in isotopically-pure silicon was measured to be approximately 2.4 MHz at a magnetic field of 440 G, which is only twice the lifetime limited linewidth set by the $^{31}$P bound exciton lifetime of 272 ns. The zero-field hyperfine splitting is 117.53 MHz whereas at zero field the linewidths amount to 70 neV $^{31}$P has a I=1/2 nuclear spin as compared to the I=3/2 for $^{87}$Rb and I=7/2 for $^{133}$Cs, leading to a simpler hyperfine splitting. The phosphorus bound exciton transitions in isotopically enriched .sup.28Si and silicon of natural isotopic composition $^{nat}$Si are shown in FIG. 1A. The difference between the spectra reveals the importance of the isotopic broadening. A schematic describing the origin of the six doublets observed in $^{28}$Si is also shown. Each doublet in the spectra is determined by the projections of the electron spin $m_e=+-1/2$ and hole angular momentum j=3/2, whereas the doublet splitting is a result of the hyperfine interactions.

Another impurity with a significantly larger hyperfine splitting is the selenium double donor. Chalcogens such as selenium give rise to a number of different donor centers in silicon. These centers can involve one, two, or more selenium atoms and can be either neutral or ionized. Because of their deep nature, the 1s state can have transitions that are not observed for shallow donors. The donor atom occupying the tetrahedral lattice site has a sixfold degenerate s state, which can be split by the central cell potential into a singlet ($A_1$), a triplet ($T_2$), and a doublet (E) or ($\Gamma_6$), ($\Gamma_8$), and ($\Gamma_7+\Gamma_8$) including spin. The valley orbit splitting is strongest for the 1s state. The transition from the $1s(A_1)$ to $1s(T_2)$ is effectively mass theory forbidden but symmetry allowed. The fact that this transition is only partially allowed contributes to its long lifetime and therefore to a narrow linewidth of approximately 240 MHz, making it possible to resolve the $^{77}$Se hyperfine splitting using this final state. The hyperfine splitting would be obscured by the isotopic broadening in natural silicon and therefore is only observable in isotopically enriched $^{28}$Si. In addition, selenium has more than one isotope and the dopant itself has been enriched to 97.1% $^{77}$Se. The resolved hyperfine splitting at zero magnetic field of 1.68 GHz and the resolved Zeeman component at a magnetic field of 2750 G are shown in FIG. 2A. The level diagram describing the individual transitions is included in FIG. 2B.

Bismuth (Bi) is the deepest group-V donor in silicon, with a binding energy of about 71 meV. Furthermore, bismuth is monoisotopic ($^{209}$Bi) with a large I=9/2 nuclear spin and also a large hyperfine interaction of 1.475 GHz. At zero magnetic field, the neutral donor $D^0$ ground state is split into a doublet having total spins of 5 and 4, which are separated by 7.377 GHz, five times the hyperfine interaction. At a nonzero magnetic field, the donor bound exciton splits into six components according to the diagram shown in FIG. 3B, each of them having 10 hyperfine subcomponents. The six components under magnetic field are determined by the electron spin and hole angular momentum analogous to the phosphorus donor.

Neutral and Ionized Impurities in Isotopically Pure Silicon

Impurities can be thermally or optically ionized, which involves removing the donor electron from the impurity center and leaving the positively charged (ionized) donor behind. Many impurities are thermally ionized at room temperature. Therefore, to maintain them, neutral cooling may be needed. Impurities that remain neutral at room temperature can be optically ionized by applying above-bandgap light to the crystal. The specifics of the optical ionization/neutralization depend on the doping level of donors and acceptors present in the crystal. However, by turning on and off above-bandgap illumination provided by a laser can lead to ionization or neutralization of impurities. By ionizing the donors and removing hyperfine coupled electrons, the temperature dependence of the coherence time changes profoundly. For the phosphorus impurities in single-isotope silicon ($^{28}$Si), spin coherence times of 4 hours at cryogenic temperatures and 30 minutes at room temperatures have been observed. At room temperature, the coherence time corresponds to a resonance frequency width of 0.00055 Hz and quality factor of $Q=2.13*10^{11}$. Achieving readout without significant broadening of the resonance by optical consecutive ionization/neutralization could lead to accurate atomic clock devices that are less sensitive to temperature.

Examples of Embodiments of the Invention

A skilled person having the advantage of the above discussion and knowledge of related art will readily appreciate that a problem caused by a need to excite an energy level transition (for the impurity(ies) atoms contained in the semiconductor medium used in an atomic clock to interrogate the hyperfine splitting) with light the frequency of which has to be substantially in resonance with such transition is solved by utilizing a detection scheme employing the spin-dependent recombination effect in such semiconductor medium, in which a change in the rate of carrier recombination in the space charge region of the p-n junction (formed in the employed semiconductor medium) is detected by observing a change in conductivity (or, alternatively or in addition, resistivity) of the semiconductor medium. As a result, the conventional requirement of excitation energy employed to excite the level transition(s) in impurity atoms is removed, the such transition can be implemented with the use of a generally broadband (non-resonant) light source such as an LED or even a source of white light, or even with a source of thermal energy.

In at least one implementation, the read-out detection system of the atomic clock apparatus is configured to detect the energy level transitions of the impurity atoms based at least in part on an electrical measurement (for example, the measurement of resistivity across the semiconductor medium) and, in a specific case—without the use of a source of laser radiation or even completely without the use of a source of light to excite the resonant energy level transition. In at least one implementation, the semiconductor device utilizing the spin-dependent recombination utilized the single-isotope silicon crystal and is configured as a pn-junction diode or a MOSFET device.

A related but independent problem caused by substantially inability of atomic clocks of related art to stably operate at a room temperature is solved by devising an atomic clock in which necessarily not all impurity atoms contained in the semiconductor medium used to achieve the hyperfine splitting are ionized but, to the contrary, the impurities are at least in part neutral.

Generally, the idea of the invention stems from the realization that increase of recombination current (generated due to recombination of electrons and holes at deep level defects in the semiconductor bandgap) caused by flipping of spin of electrons at the trap site when the magnetic field applied to the target semiconductor material satisfies the resonant condition, can be used as an indicator of the energy level transition of the impurity atoms in such semiconductor material and, therefore, as a foundation for configuring an atomic clock. Notably, while the spin-dependent recombination (SDR)—a technique with the use of which one can make equivalent series resistance (ESR) measurements on fully processed devices including devices in integrated circuits and which exploits the spin-dependent nature of recombination events to observe ESR through measurement of recombination currents—has been considered, for example, for detection of magnetic resonance metal-oxide-semiconductor field-effect transistors (J. P Ashton et al., in J. Appl. Phys. 129, 083903 (2021); doi: 10.1063/5.0042484; N. J. Harmon et al., in IEEE Trans. On Nuclear Science, v. 67, No. 7, July 2020), the utilization of this effect for the purpose of realizing an atomic clock has not been considered by related art.

A qualitative explanation of SDR, first proposed by Lepine (Phys. Rev. B 6, 436, 1972), combines the Shockley-Read-Hall (SRH) recombination model and Pauli Exclusion Principle.

Figure 5:
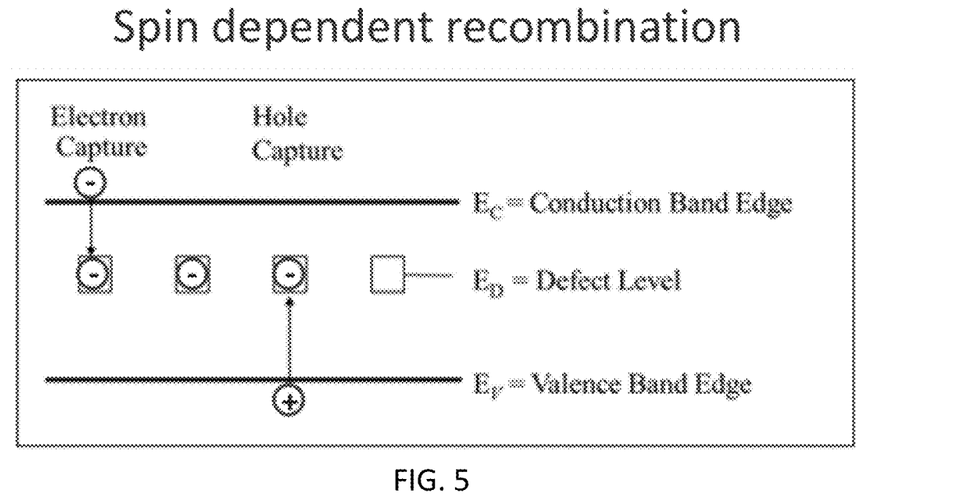
FIG. 5, which presents a schematic depiction of the Shockley-Read-Hall model.

According to the SRH model, recombination of electrons and holes takes place through deep level defects in the semiconductor bandgap. An electron is trapped at a deep level defect, then a hole is trapped at the same deep level defect. (The sequence could obviously be reversed, with a hole being trapped first at a deep level defect, then an electron.) Interface defect levels in the band gap act as recombination centers. This process is illustrated in FIG. 5, which presents a schematic depiction of the SRH model.

Figure 6:
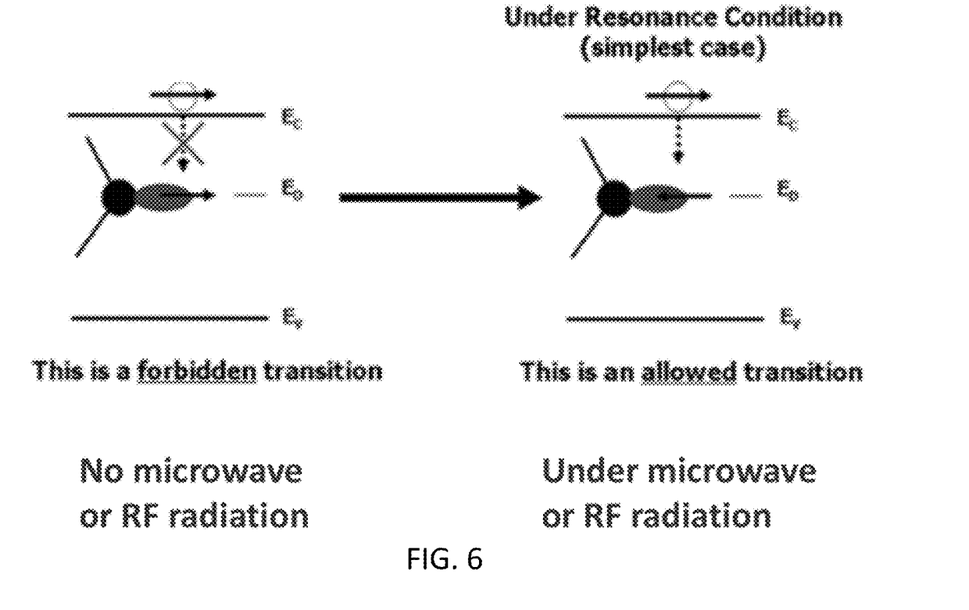
FIG. 6 schematically illustrates spin flipping when a resonant condition is satisfied

Considering, as a specific and non-limiting example, the situation when the deep level defect is a "dangling bond," such dangling bond has an unpaired electron when it is electrically neutral. If both the dangling bond and conduction electrons have the same spin orientation, the conduction electron cannot be captured at the site because two electrons may not occupy the same orbital with the same spin quantum number. By placing a chosen semiconductor device in a strong magnetic field, however (which filed polarizes the conduction electrons and holes as well as the spins of the dangling bond electrons, thereby tending to orient such spins with the applied magnetic field), the SRH recombination is initiated with the electron capture (or hole capture) at the deep level site. In ESR, electron spins are "flipped" from one spin orientation to the other when the resonance condition is satisfied. The spin flipping at the trap site increases the probability of oppositely oriented traps and conduction electron spins, allowing the trapping event and recombination, see FIG. 6. (Here, as I schematically illustrated, if both conduction electrons and deep level electron spins point the same way, the trapping event is forbidden. By satisfying the ESR condition, the deep level spin is flipped, thereby allowing the capture event.) This process increases the recombination current.

Figure 7:
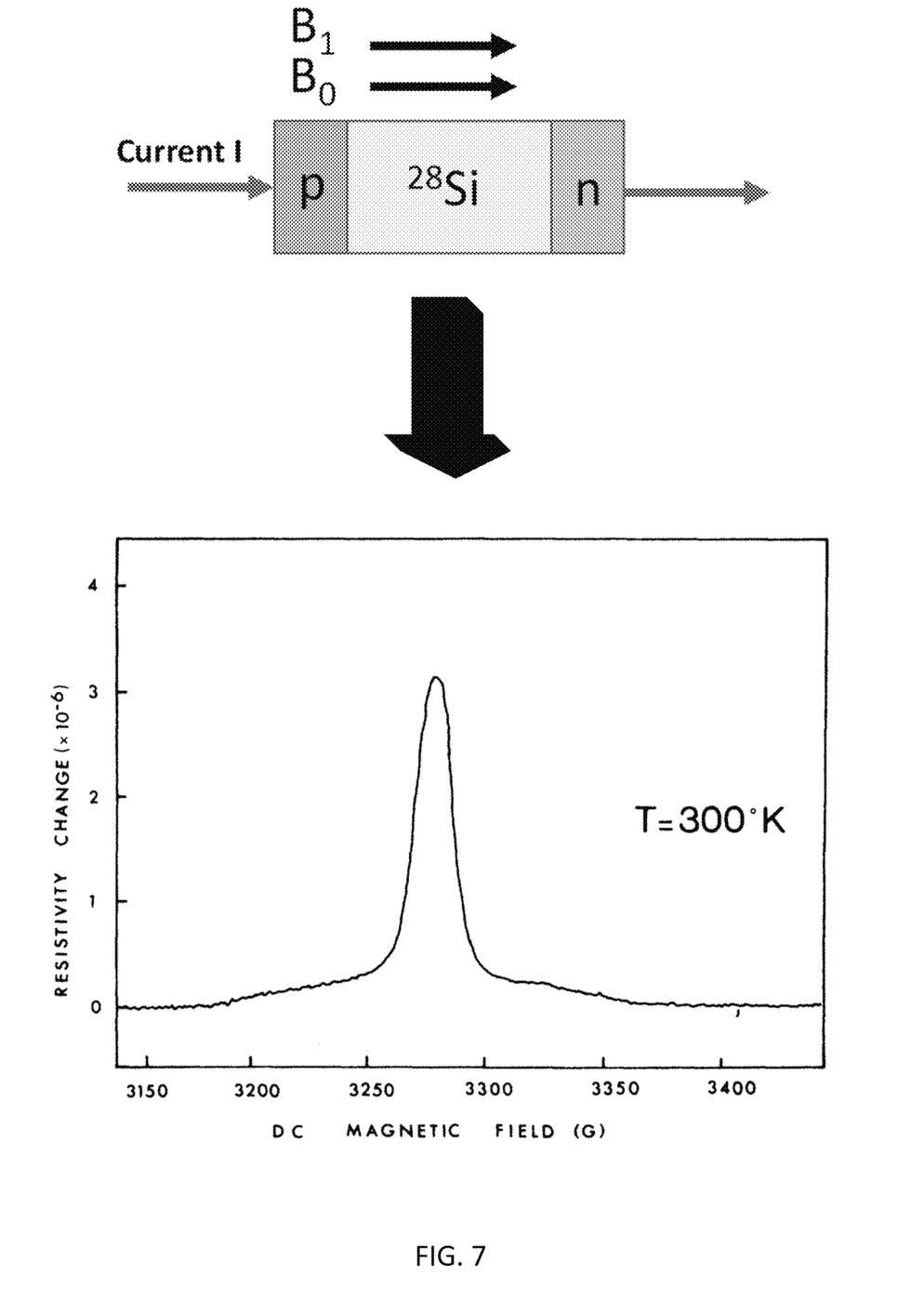
FIG. 7 illustrates an embodiment of the single-isotope silicon crystal-based device of the invention and the assessment of the resonant condition (according to the SRH model) with the measurement of resistivity or conductivity across the silicon crystal of such a device.

Accordingly, in an embodiment of the invention, a semiconductor device is configured with the use of a single-isotope silicon crystal doped with impurity atoms is placed in a slowly varying magnetic field and microwave radiation (or radio-frequency, RF, radiation) while the impurity atoms are being excited with external energy that is generally and preferably non-resonant with the energy level transition of the impurity atoms. FIG. 7 illustrates an example of such arrangement in which the semiconductor device may be configured as a pn-junction photodiode that is structured on the basis of the single-isotope silicon crystal with identified impurities. (The source of such external energy is not shown in FIG. 7 for simplicity of illustration). The increase in recombination current, occurring increase when the applied magnetic field and microwave frequency satisfy the resonance condition, is indicative of such resonance condition. (In at least one case, the presence/satisfaction of the resonance condition is registered by measuring the resistivity or conductivity across the silicon crystal, as shown in the example of FIG. 7.)

Figure 8:
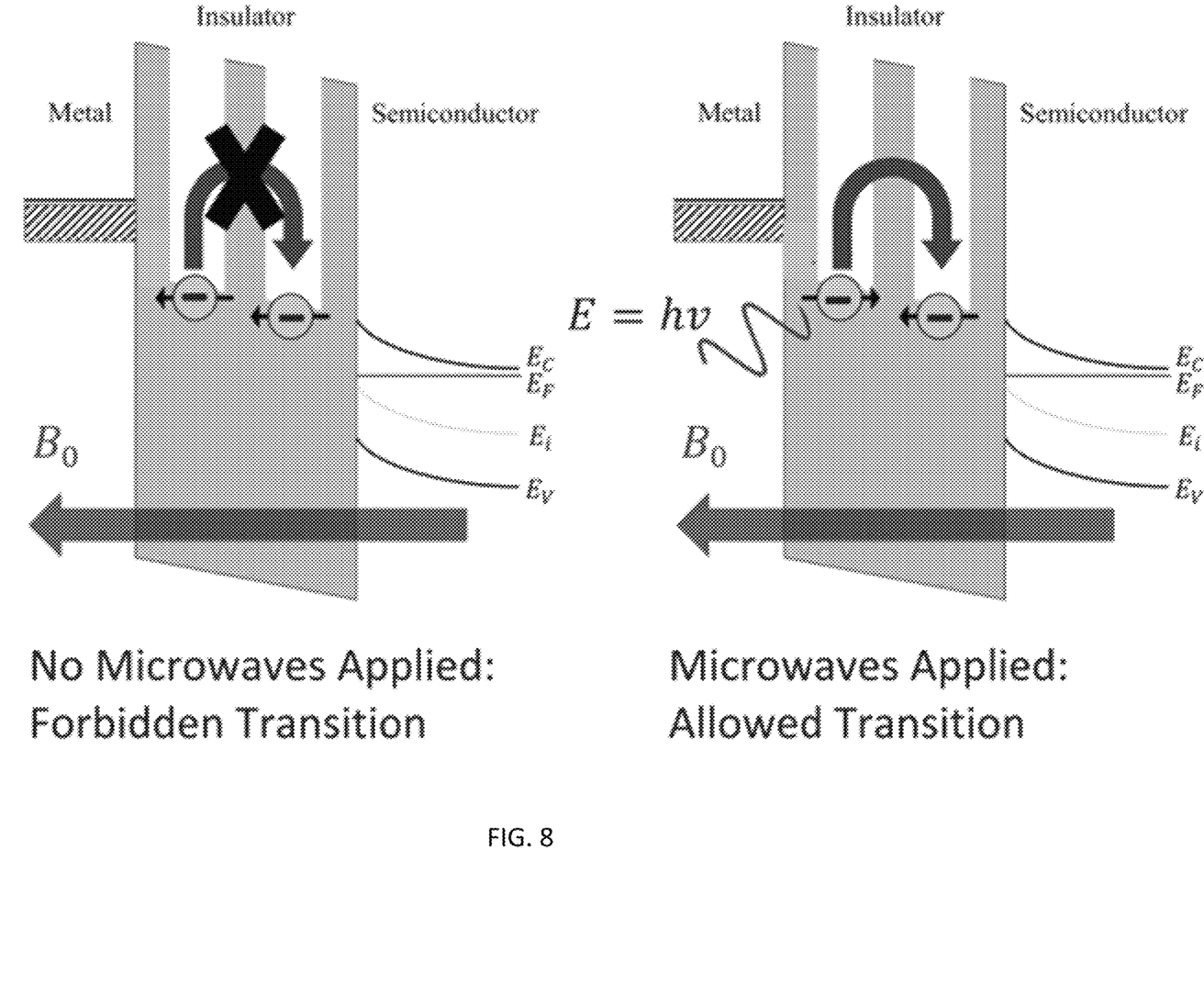
FIG. 8 illustrates spin-dependent transport in a MOS interface facilitates by spin-dependent recombination.
Figure 9A:
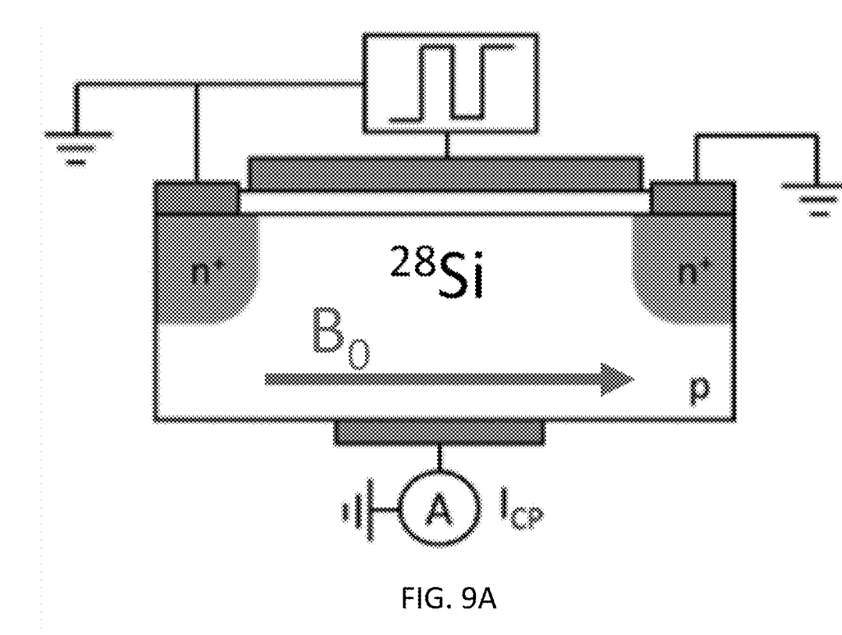
FIGS. 9A, 9B schematically illustrate a related embodiment of the single-isotope silicon crystal-based MOSFET-type device, structured according to the idea of the invention and the process of spin-dependent transport in such device facilitated by the spin-dependent recombination, according to the idea of the invention
Figure 9B:
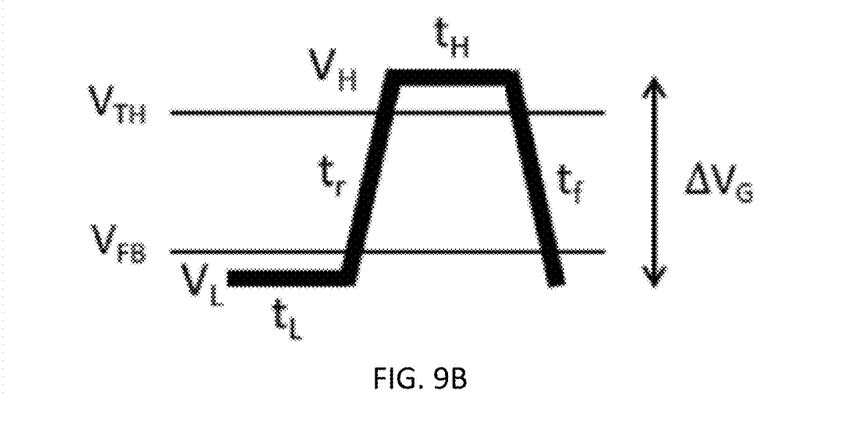

The idea of operation of a related embodiment, in which the single-isotope crystal-based semiconductor device is configured as a MOSFET device for use in an implementation of atomic clock that utilizes the spin-dependent recombination effect for operation is schematically depicted in FIGS. 8, 9A, and 9B. Here, spin dependent transport in a MOSFET device of FIG. 9A is facilitated with spin-dependent recombination. FIG. 9B: the high-frequency tooth saw-voltage, applied to the silicon crystal, facilitates spin-dependent charge pumping thereby increasing the signal-to-noise ratio of the readout.

Overall, in an implementation of an atomic clock according to the idea of the invention, the device configured to detect the energy level transition if the impurity atoms based at least in part on the spin-dependent recombination in the silicon crystal needs to be configured in such a way as to have the measured current be strongly influenced by recombination events. In the case of specific implementation in which such device may be optionally configured to include a MOSFET built with the use of the single-isotope crystal this can be done by connecting (shorting) the source and drain to act as a gate-controlled diode and biasing the device across the gate in such a way as to form a depletion region at the semiconductor-oxide interface. One could then measure the recombination current from the substrate to the source-drain junction.

Figure 10:
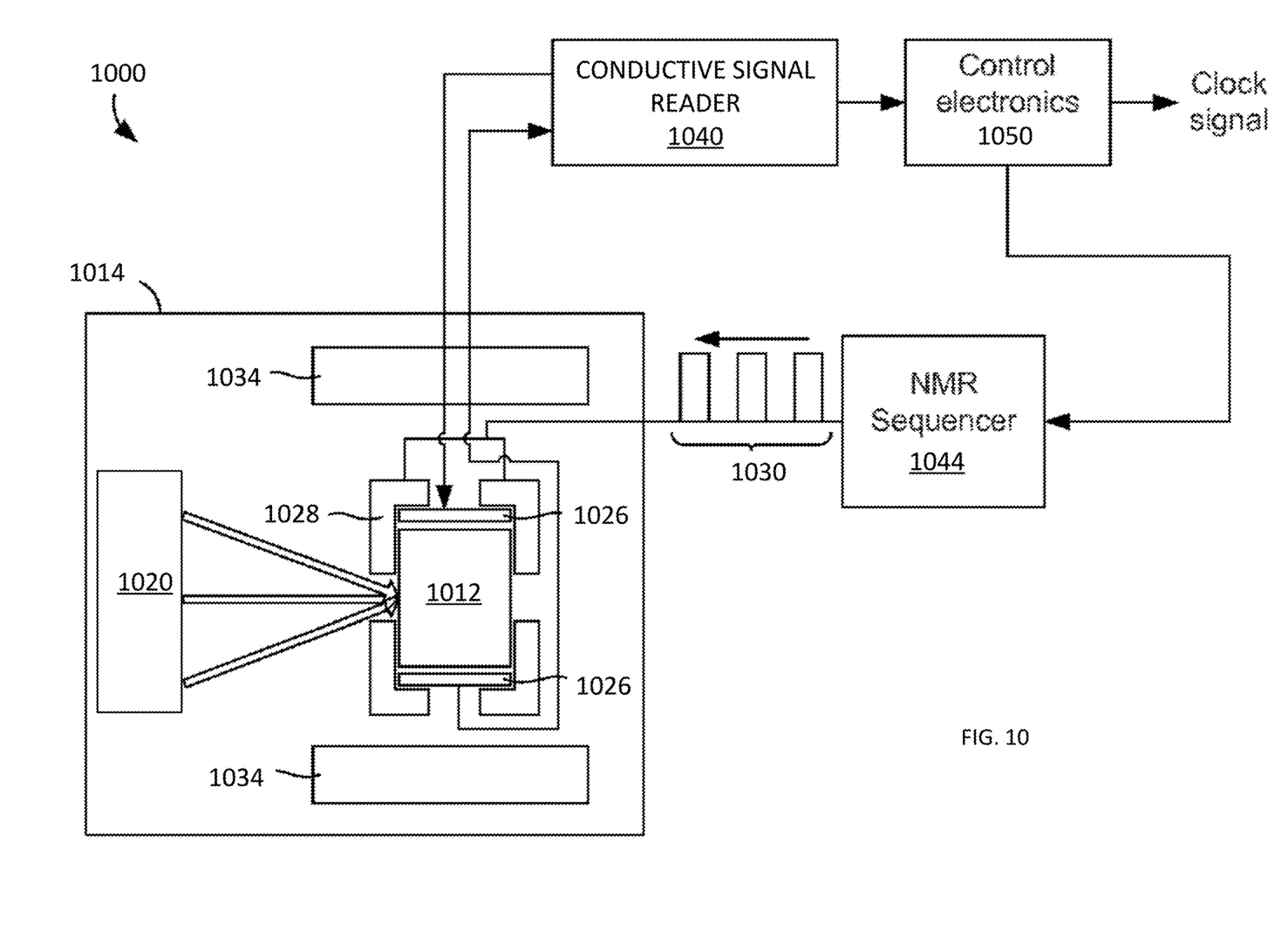
FIG. 10 is a schematic block diagram of an embodiment of a silicon-based atomic clock configured according to an idea of the present invention.

FIG. 10 schematically illustrates a non-limiting and specific embodiment silicon-based atomic clock 1000 configured according to the idea of the invention that can, for instance, be integrated into a compact (e.g., portable) electronic device. As shown in FIG. 10, the atomic clock 1000 includes a device 1012 structured with the use of a single-isotope silicon crystal that is doped with impurity atoms. The device 1012 may include a structure substantially similar to that of FIG. 7 or that of FIG. 9A. The silicon crystal of the device 1012 can be supported on a suitable substrate (not shown), for example, in a manner in which it is in an unstressed, strain-free state. Optionally—and in at least one implementation—the device 1012 is contained within a temperature-controlled housing 1014. (Such housing can be cooled by an appropriate cooling apparatus (not shown), for example by a thermoelectric cooler or a liquid gas cooling apparatus.

The embodiment of the clock 1000 is further complimented with an external system of sources of energy (aggregately labelled as 1020), which contains a source of excitation energy that is not resonant (in stark contradistinction with related art) with the energy level transitions available in impurity atoms of the silicone crystal of the device 1012 and, at least in one specific case may include a source of broadband light (such as an LED or even a source of white light) or even no source of light at all. (In the latter case, the system 1020 contains a source of thermal energy that is employed as a source of energy used for excitation of impurity atom energy level transitions that result in the hyperfine splitting. In addition, the system 1020 may include a laser source of light such as a VCSEL or distributed feedback diode laser—which may have a wavelength in the near infrared (NIR) spectrum. When the system 1020 is chosen to contain multiple sources of energy—among which, for example, there is a source of energy that is non-resonant with the energy level transitions in the impurity atoms and a laser source—the first one can be used to excite the impurity atoms, and a laser source can be employed to populate the hyperfine split levels and/or to optically ionize/neutralize the impurities.

The device 1012 is generally configured to measure a current of a p-n junction formed in the kernel silicon crystal (such current being dependent on the recombination rate in the space charge region of the junction) and, at least in one specific case—to measure a resistivity across the silicon crystal of the device 1012. In a specific example depicted in FIG. 10, placed at opposite ends or sides of the silicon crystal of the device 1012 are capacitor plates 1026 that are configured to be used to detect the hyperfine splitting resonance of impurity bound excitons. In particular, the capacitor plates 1026 can be used to detect the resonance as a change in conductivity/capacitance of the silicon crystal (which, when thermal excitation energy is used, is not photoconductivity). Because of the relatively high efficiency of Auger recombination, the resonance can be detected when relatively few impurity atoms (e.g., about $10^{12}$ cm$^{-3}$ to $10^{14}$ cm$^{-3}$) are present in the silicon crystal of the device 1012.

The silicon crystal-based device 1012 is complemented with a first magnetic coil 1028 that can be configured used to probe or interrogate the hyperfine splitting. The coil 1028 can be energized using a nuclear magnetic resonance (NMR) sequence that comprises RF or microwave pulses 1030 that cause the hyperfine splitting levels to resonate. In some embodiments, a pulse sequence is used that does not completely remove the phase accumulation associated with frequency drifts. A second magnetic coil 1034 can, for example, also surround the silicon crystal of the device 1012 to thereby apply a constant electric field to the crystal that creates a small amount of Zeeman splitting.

As is further shown in FIG. 10, the clock 1000 may be additionally equipped with a conductive signal reader 1040 configured to send signals to and to receives signal from the capacitor plates 1026, an NMR sequencer 1044 that generates the NMR sequences for the first magnetic coil 1028, and control electronic circuitry 1050 that receives signals from the conductive signal reader 1040 to provide control signals to the NMR sequencer 1040 and to output clock signals, which can be directed to the associated with the clock 1000 electronic device.

During operation of the silicon-based atomic clock 10000, the single-isotope silicon crystal 1012 in at least one case is maintained at a desired temperature within the housing 1014 and a static magnetic field is applied to the crystal by the second magnetic coil 1034. Non-resonant with the level transition(s) of impurity atoms energy, generated by the source(s) of the system 1020 is directed to impinge upon the silicon crystal of the device 1012 so as to cause energy level transitions for the impurity atoms contained within the crystal. As a result of these transitions, hyperfine splitting occurs. The hyperfine splitting levels can be caused to resonate by energizing the first magnetic coil 1028 with an NMR sequence generated by the NMR sequencer 1044. That resonance is then detected by the device configured to detect the energy level transition based at least in part on an electrical measurement (in the example of FIG. 10—the plate 16) as a change in conductivity (that is not photoconductivity when the excitation energy does not include optical energy), and such change can be then read by the conductive signal reader 1040. The conductive signal reader 1040 then directs the reading to the control circuitry 1050, which in turn generates a clock signal based upon such reading. In addition, the control electronics 1050 is optionally configured to provide control signals to the NMR sequencer 1044 to alter the NMR sequences 1030 directed to the first magnetic coil 1028.

As a skilled artisan will readily understand in relation to FIG. 10, the resonance of the hyperfine splitting levels can generally be detected electrically, optically, or through a combination of the two. When electrical detection is used, such as the current detection scheme described above, the change in conductivity resulting from Auger electrons is detected using a noncontact, capacitive conductivity approach. The noncontact nature of this approach eliminates a possibility of straining the crystal as well as the need for ohmic contacts. When optical detection is used, resonance can, for example, be detected using a distributed feedback Yb-doped fiber laser that is fed into a Yb-doped fiber amplifier. The detailed spectra may be needed, in which case the laser frequency may need to be locked to an external cavity and scanned by changing the fiber temperature.

Other methods can also be used to detect hyperfine splitting resonance. In one embodiment, electron paramagnetic resonance (EPR) can be used to detect the paramagnetic V$^{++}$ ions in MgO. Derivatives of the EPR method of detecting impurity resonances in silicon that can also further used include electron-nuclear double resonance (ENDOR), low-field electrically detected magnetic resonance (LFEDMR), which provides better sensitivity in the spin carrying isotope $^{28}$Si but is technologically more challenging, and electrically detected magnetic resonance (EDMR).

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes. Other specific examples of the meaning of the terms "substantially", "about", and/or "approximately" as applied to different practical situations may have been provided elsewhere in this disclosure.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

For the purposes of this disclosure and the appended claims, the expression of the type "element A and/or element B" is defined to have the meaning that covers embodiments having element A alone, element B alone, or elements A and B taken together and, as such, is intended to be equivalent to "at least one of element A and element B".

While the invention is described through the above-described specific non-limiting embodiments, it will be understood by those of ordinary skill in the art that modifications to, and variations of, the illustrated embodiments may be made without departing from the inventive concepts disclosed herein. The disclosed aspects may be combined in ways not listed above. Accordingly, the invention should not be viewed as being limited to the disclosed embodiment(s).

The invention claimed is:

1. A silicon-based atomic clock configured for use in an electronic apparatus, the atomic clock comprising:
    a single-isotope silicon crystal doped with impurity atoms configured to have an energy level transition of the impurity atoms to be used as a frequency resonance of the atomic clock;
    a source of energy configured to excite the impurity atoms within the single-isotope silicon crystal; and
    a device configured to detect the energy level transition of the impurity atoms based at least in part on a spin-dependent recombination in said single-isotope silicon crystal;
    wherein the atomic clock further comprises a first magnetic coil surrounding at least a portion of said single-isotope silicon crystal, wherein the first magnetic coil is configured to provide a first magnetic field to drive a hyperfine resonance of the impurity atoms by generating an initial spin coherence of impurity nuclei within said silicon crystal;
    wherein at least one of the following conditions is satisfied:
    (i) wherein the first magnetic coil is configured to provide a static second magnetic field, wherein a first vector of the first magnetic field is substantially parallel to a second vector of the second magnetic field, and
    (ii) the atomic clock further comprises a second magnetic coil surrounding at least a portion of said silicon crystal, wherein the second magnetic coil is configured to provide said static second magnetic field, wherein the first vector of the first magnetic field is substantially parallel to the second vector of the second magnetic field.

2. An atomic clock according to claim 1, wherein the source of energy is configured as
    (2A) a source of thermal energy but not a source of light, or
    (2B) a source of broadband light that is not matched to said energy level transition of the impurity atoms.

3. An atomic clock according to claim 2, wherein, when the source of energy is configured as said source of broadband light, said broadband light is not substantially resonant with the energy level transition.

4. An atomic clock according to claim 3, wherein the source of energy is a light-emitting diode.

5. An atomic clock according to claim 1, wherein
    (5A) the single-isotope silicon crystal is $^{28}$Si crystal; and/or
    (5B) the impurity atoms are single-isotope impurity atoms; and/or
    (5C) wherein the impurity atoms are selected from the group consisting of phosphorus (P) atoms, arsenic (As) atoms, antimony (Sb) atoms, lithium (Li) atoms, sodium (Na) atoms, sulfur(S) atoms, selenium (Se) atoms, tellurium (Te) atoms, boron (B) atoms, gallium (Ga) atoms, indium (In) atoms, aluminum (Al) atoms, beryllium (Be) atoms, zinc (Zn) atoms, gold (Au) atoms, silver (Ag) atoms, platinum (Pt) atoms, bismuth (Bi) atoms, and copper (Cu) atoms, a defect caused by irradiation of the silicon crystal, and combinations thereof.

6. An atomic clock according to claim 1, wherein said device is configured to measure a current of a p-n junction formed in said semiconductor crystal, wherein said current is dependent on a recombination rate in the space charge region of said p-n junction.

7. An atomic clock according to claim 1,
(7A) wherein said device is configured to measure a resistivity across said silicon crystal,
and/or
(7B) wherein the atomic clock comprises a p-i-n junction diode or a MOSFET, and/or
(7C) wherein the atomic clock comprises a read-out device configured to interrogate hyperfine splitting that results from interaction of the impurity nuclei and donor electrons.

8. An atomic clock according to claim 1, configured to operate at a substantially room temperature.

9. An atomic clock according to claim 8, wherein at least one of the following conditions is satisfied:
(9A) the atomic clock is configured to have at least a portion of said impurity atoms neutral and not ionized; and
(9B) wherein a doping density of said single-isotope silicon crystal with said impurity atoms is in the range from about $5 \times 10^{16}$ cm$^{-3}$ to about $5 \times 10^{18}$ cm$^{-3}$ to form impurity energy levels in a conduction band of the single-isotope silicon crystal that are no longer discrete but broadened due to impurity pairs and clusters, thereby maintaining a portion of the impurity toms substantially neutral at room temperature.

10. The atomic clock according to claim 1, wherein the atomic clock does not include a photodetector.

11. A method, comprising:
with the use of the atomic clock according to claim 1:
exciting an energy level transition in said single-isotope silicon crystal doped with impurity atoms under circumstances when a frequency of excitation energy is not resonant with said energy level transition, wherein said exciting does not include exciting with the use of light;
detecting the energy level transition based at least in part on a spin-dependent recombination in said single-isotope silicon crystal; and
generating a clock signal based upon a detected energy level transition.

12. A method according to claim 11, further comprising: isotopically purifying silicon to produce said single-isotope silicon crystal and doping said single-isotope silicon crystal with the impurity atoms.

13. A method according to claim 11, comprising doping said single-isotope silicon crystal with the impurity atoms selected from the group consisting of phosphorus (P) atoms, arsenic (As) atoms, antimony (Sb) atoms, lithium (Li) atoms, sodium (Na) atoms, sulfur(S) atoms, selenium (Se) atoms, tellurium (Te) atoms, boron (B) atoms, gallium (Ga) atoms, indium (In) atoms, aluminum (Al) atoms, beryllium (Be) atoms, zinc (Zn) atoms, gold (Au) atoms, silver (Ag) atoms, platinum (Pt) atoms, bismuth (Bi) atoms, and copper (Cu) atoms, a defect caused by irradiation of the silicon crystal, and combinations thereof.

14. A method according to claim 11,
(15A) wherein said detecting the energy level transition includes detecting resonance of hyperfine splitting levels resulting for the energy transitions by measuring a resistivity across said single-isotope silicon crystal;
and/or
(15B) wherein said detecting includes measuring a current of a p-n junction formed in said single-isotope silicon crystal, wherein said current is dependent on a recombination rate in a space charge region of said p-n junction.

15. A method according to claim 11, further comprising providing a first magnetic field with the use of a first magnetic coil that surrounds at least a portion of said single-isotope silicon crystal to drive a hyperfine resonance of the impurity atoms by generating an initial spin coherence of impurity nuclei within said single-isotope silicon crystal.

16. A method according to claim 15, further comprising at least one of the following:
(18A) with the use of the same first magnetic coil, providing a static second magnetic field, wherein a first vector of the first magnetic field is substantially parallel to a second vector of the second magnetic field;
and
(18B) providing a static second magnetic field with the use of a second magnetic coil surrounding at least a portion of said silicon crystal, wherein the first vector of the first magnetic field is parallel to the second vector of the second magnetic field.

17. A method according to claim 15, wherein said detecting the energy level transition includes detecting the energy level transition with the first magnetic coil.

* * * * *